United States Patent
Lue

(10) Patent No.: US 9,356,105 B1
(45) Date of Patent: May 31, 2016

(54) RING GATE TRANSISTOR DESIGN FOR FLASH MEMORY

(71) Applicant: MACRONIX INTERNATIONAL CO., LTD., Hsinchu (TW)

(72) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/584,871

(22) Filed: Dec. 29, 2014

(51) Int. Cl.
| | |
|---|---|
| *H01L 27/115* | (2006.01) |
| *G11C 16/04* | (2006.01) |
| *H01L 29/423* | (2006.01) |
| *G11C 16/08* | (2006.01) |
| *H01L 29/792* | (2006.01) |

(52) U.S. Cl.
CPC ............ *H01L 29/4234* (2013.01); *G11C 16/08* (2013.01); *H01L 27/1157* (2013.01); *H01L 29/792* (2013.01)

(58) Field of Classification Search
CPC ...................... H01L 27/11565; H01L 27/1157; H01L 27/11578; H01L 27/11519; H01L 27/1156; H01L 27/11524; H01L 27/11551; H01L 29/4234; H01L 29/42376; H01L 29/42324; G11C 16/0408; G11C 16/0466
See application file for complete search history.

(56) References Cited

U.S. PATENT DOCUMENTS

| | | | | |
|---|---|---|---|---|
| 6,639,270 | B2 * | 10/2003 | Dray ................... | H01L 29/7886 257/315 |
| 6,906,940 | B1 | 6/2005 | Lue | |
| 7,315,474 | B2 | 1/2008 | Lue | |
| 7,402,874 | B2 * | 7/2008 | Wu ................... | H01L 27/11206 257/315 |
| 7,420,242 | B2 | 9/2008 | Lung | |
| 7,671,475 | B2 * | 3/2010 | Kamigaichi ....... | G11C 16/0483 257/315 |
| 7,696,559 | B2 | 4/2010 | Arai et al. | |
| 7,851,849 | B2 | 12/2010 | Kiyotoshi | |
| 8,062,944 | B2 * | 11/2011 | Higashitani ........... | H01L 23/552 257/E21.422 |
| 8,363,476 | B2 | 1/2013 | Lue et al. | |
| 8,467,219 | B2 | 6/2013 | Lue | |

(Continued)

FOREIGN PATENT DOCUMENTS

EP         2048709 A2    4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Allison P Bernstein
(74) *Attorney, Agent, or Firm* — Yiding Wu; Haynes Beffel & Wolfeld LLP

(57) ABSTRACT

A memory device includes a semiconductor body having a first conductivity type, a first terminal in the semiconductor body having a second conductivity type, a channel region having the first conductivity type surrounding the first terminal, and a second terminal having the second conductivity type surrounding the channel region. A connector is in contact with the first terminal, and can be connected to a bit line in an overlying patterned conductor layer. Memory material is disposed over the channel region, and can include a dielectric charge storage structure. A control gate surrounds the first terminal and is disposed over the memory material. A conductive line surrounds the control gate and is in contact with the second terminal. The control gate and the conductive line can be ring shaped.

26 Claims, 9 Drawing Sheets

(56) References Cited

U.S. PATENT DOCUMENTS

| | | | |
|---|---|---|---|
| 8,503,213 | B2 | 8/2013 | Chen et al. |
| 8,552,510 | B2* | 10/2013 | Onda ................. H01L 27/0207 257/240 |
| 8,759,899 | B1 | 6/2014 | Lue et al. |
| 9,112,037 | B2* | 8/2015 | Yamazaki ......... H01L 29/41733 |
| 2005/0280061 | A1 | 12/2005 | Lee |
| 2006/0038233 | A1* | 2/2006 | Otsuki .............. H01L 21/28123 257/365 |
| 2007/0045708 | A1 | 3/2007 | Lung |
| 2007/0252201 | A1 | 11/2007 | Kito et al. |
| 2007/0290232 | A1* | 12/2007 | Nishiyama ............ H01L 27/105 257/202 |
| 2008/0073635 | A1 | 3/2008 | Kiyotoshi et al. |
| 2008/0157195 | A1* | 7/2008 | Sutardja .......... H01L 21/823437 257/337 |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2012/0119283 | A1 | 5/2012 | Lee et al. |
| 2012/0182806 | A1 | 7/2012 | Chen et al. |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," 2007 Symp. VLSI Tech., Digest of Tech. Papers, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

RING GATE TRANSISTOR DESIGN FOR FLASH MEMORY

BACKGROUND

1. Field of the Technology

The present technology relates to design for reliability of memory cells in charge trapping flash memories.

2. Description of Related Art

In charge trapping flash memories, shallow trench isolation (STI) edge fringing field effect can occur in a near planar structure, a body-tied FinFET structure, a self-aligned STI structure, and a gate-all-around thin film transistor structure. STI edge fringing field effect can cause abnormal subthreshold current during programming of charge trapping flash memories. The edge fringing field effect can degrade the tunnel oxide electric field, change the program/erase (P/E) speed, lead to large device variation, and degrade the incremental-step-pulse programming (ISPP) slope. Consequently, the STI edge fringing field effect degrades the reliability of charge trapping flash memories, including three dimensional flash memories, as charge trapping flash memories are scaled down.

It is desirable to provide a more reliable memory cell structure for charge trapping flash memories, including NAND flash and NOR flash.

SUMMARY

A memory cell structure including a ring-shaped gate or gates surrounding a terminal configured as a source or drain, is described which can be implemented in an array without trench isolation on a planar substrate. The memory cell structure can include one or more memory cells. The memory cell structure can be used to provide memory cells that have excellent data retention characteristics. Arrays of the memory cell structure can be disposed on an integrated circuit substrate with a high density array of memory cells having a different structure, and deployed to provide a high-retention block of memory to complement the high density memory.

A memory device includes a semiconductor body having a first conductivity type, such as p-type, a first terminal in the semiconductor body having a second conductivity type, such as n-type, a channel region having the first conductivity type surrounding the first terminal, and a second terminal having the second conductivity type surrounding the channel region. A connector is in contact with the first terminal, and can be connected to a bit line in an overlying patterned conductor layer. Memory material is disposed over the channel region, and can include a dielectric charge storage structure.

A control gate surrounds the first terminal and is disposed over the memory material, which in turn is disposed over the channel region in the semiconductor body. A voltage applied to the control gate can change the current through the channel region, as required by operations to write, read and erase a ring gate memory cell that includes the control gate and the channel region. A conductive line surrounds the control gate and is in contact with the second terminal. The control gate and the conductive line can be ring shaped.

The semiconductor body can include a pickup terminal having the first conductivity type located outside the conductive line, and including a connector in contact with the pickup terminal. The semiconductor body can be planar (i.e. no etched edges) between the first and second terminals. In some embodiments, there can be no insulator filled trenches in the semiconductor body between the first and second terminals.

The memory device can include a second channel region in the semiconductor body surrounding the first mentioned channel region and inside the conductive line, and a second gate surrounding the control gate and over the second channel region.

The memory device can include a plurality of concentric channel regions surrounding the first terminal, the plurality including the first mentioned channel region, and a plurality of concentric gates over the plurality of concentric channel regions, the plurality of concentric gates including the control gate. The plurality of concentric channel regions can be elements of a NAND string between the first terminal and the second terminal.

In one implementation, a memory device includes a ring gate NAND cell, which includes a semiconductor body having a first conductivity type (p-type), a first terminal in the semiconductor body having a second conductivity type (n-type), and a second terminal in the semiconductor body having the second conductivity type. A connector is in contact with the first terminal. A plurality of concentric gates is disposed surrounding the first terminal and over the semiconductor body, including at least an inner concentric gate (SSL) surrounding the first terminal, a plurality of intermediate concentric gates (WLs) surrounding the inner concentric gate, and an outer concentric gate (GSL) surrounding the plurality of intermediate concentric gates.

Memory material is disposed between the plurality of intermediate concentric gates and the semiconductor body. A gate dielectric layer is disposed between the inner concentric gate and the semiconductor body and between the outer concentric gate and the semiconductor body. A conductive line is disposed surrounding the plurality of concentric gates, and is in contact with the second terminal. A ring gate as used in the present specification has a cross-section that can be square, rectangular, or circular.

The semiconductor body can include an N-well, and the semiconductor body can be inside the N-well. The first terminal and the second terminal can be inside the semiconductor body and can include N+ doping. In one embodiment, the gate dielectric layer can include the memory material. In another embodiment, the gate dielectric layer can include material different than the memory material.

The memory device can include an array of ring gate NAND cells, including the first mentioned ring gate NAND cell, having respective first terminals, and including a first plurality of patterned conductor lines connected to the first terminals of the ring gate NAND cells in the array. Patterned conductor lines in the first plurality of patterned conductor lines can have a first pitch. Ring gate NAND cells in the array can have a ring gate NAND cell pitch greater than the first pitch. A row of ring gate NAND cells in the array of ring gate NAND cells can be placed with an offset to match the first pitch.

The memory device can include a plurality of conductors connecting respective concentric gates in the plurality of concentric gates in a row of ring gate NAND cells in the array of ring gate NAND cells. Conductors in the plurality of conductors connected to inner concentric gates in the plurality of concentric gates can be coupled to first decoding circuitry. Conductors in the plurality of conductors connected to intermediate concentric gates in the plurality of concentric gates can be coupled to second decoding circuitry. Conductors in the plurality of conductors connected to outer concentric gates in the plurality of concentric gates can be coupled to third decoding circuitry. The memory device can include a conductor connecting the conductive lines in ring gate NAND cells in the array.

The array of ring gate NAND cells can be disposed in a first region on a substrate. The memory device can include a multilayer array of NAND strings disposed in a second region on the substrate. The multilayer array can include active strips disposed in a plurality of levels on the substrate, a plurality of structures of a conductive material arranged orthogonally over the active strips in the plurality of levels, and memory elements in interface regions at cross-points between surfaces of the active strips in the plurality of levels and the plurality of structures.

Levels in the plurality of levels extend over both the first region and the second region. The array of ring gate NAND cells in the first region can be disposed on an upper level in the plurality of levels, and the active strips in the second region can be disposed in at least some levels lower than the upper level.

The memory device can include interlayer connectors connected to the active strips disposed in the plurality of levels. The interlayer connectors can extend from respective levels in the plurality of levels to a connector surface higher than a top level in the plurality of levels. The memory device can include a second plurality of patterned conductor lines on top of the connector surface and connected to the respective interlayer connectors.

The memory device can include a first plurality of patterned conductor lines connected to the connectors in the array of ring gate NAND cells, where patterned conductor lines in the first plurality of patterned conductor lines have a first pitch, and patterned conductor lines in the second plurality of patterned conductor lines have a second pitch that matches the first pitch. In one embodiment, the first plurality of patterned conductor lines in the array of ring gate NAND cells and the second plurality of patterned conductor lines connected to the interlayer connectors can include the same patterned conductor lines.

In an alternative embodiment, the array of ring gate NAND cells can be disposed in a first region on a substrate, and the memory device can include a logic circuit such as a processor or a gate array disposed in a second region on the substrate.

An array of ring gate NOR cells is also described.

Other aspects and advantages of the present technology can be seen on review of the drawings, the detailed description and the claims, which follow.

DETAILED DESCRIPTION

Figure 1:
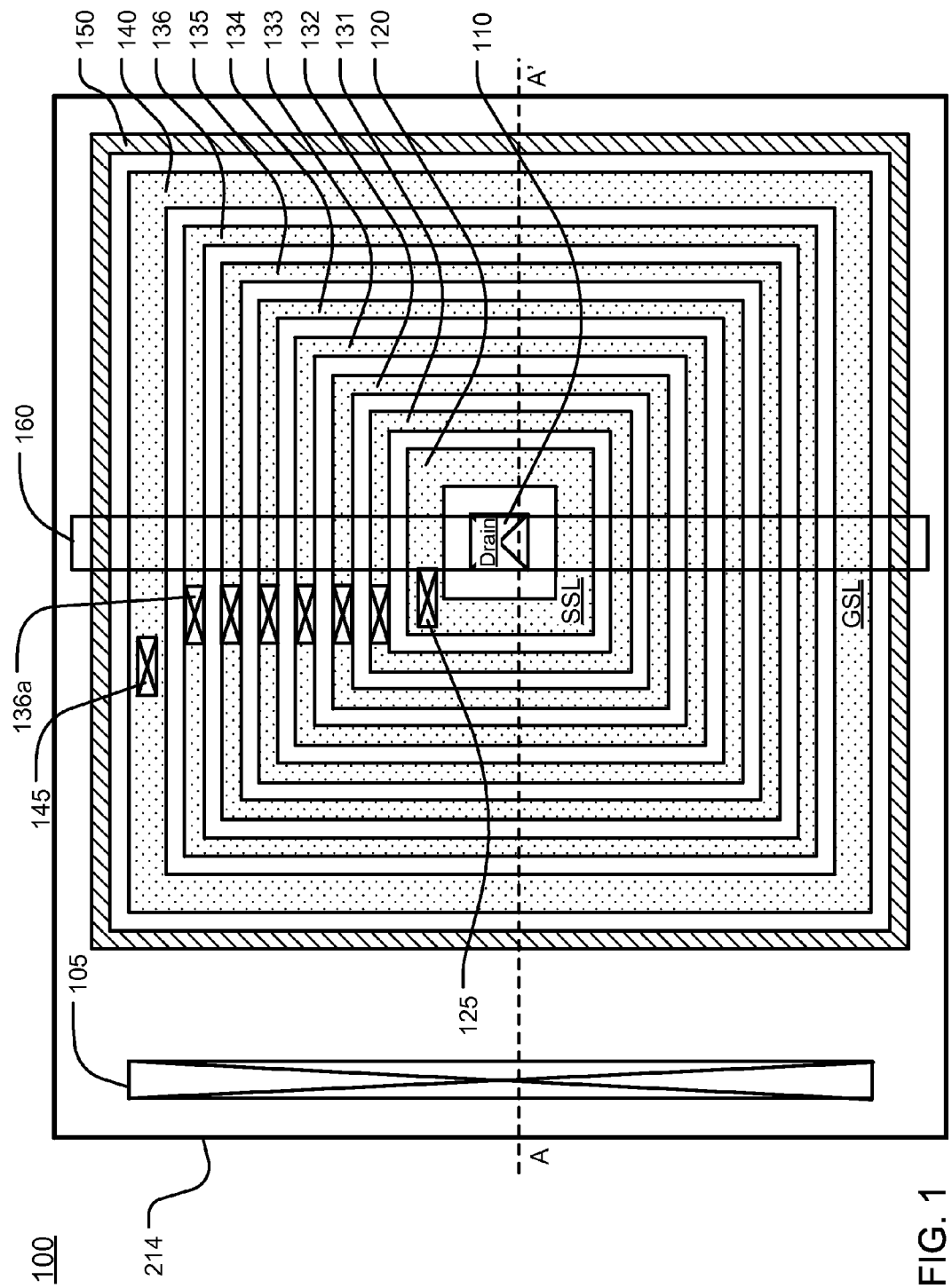
FIG. 1 illustrates a top view of an example ring gate NAND cell in a memory device.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 illustrates a top view of an example ring gate NAND cell in a memory device (e.g. 100). The ring gate NAND cell includes a semiconductor body (e.g. 214) having a first conductivity type such as P-type, a first terminal (e.g. 216, FIG. 2) in the semiconductor body having a second conductivity type such as N-type, a channel region having the first conductivity type surrounding the first terminal, and a second terminal (e.g. 218, FIG. 2) in the semiconductor body having the second conductivity type surrounding the channel region. A connector (e.g. 110) is in contact with the first terminal, and can act as a drain terminal of the ring gate NAND cell. Memory material (e.g. 220, FIG. 2) is disposed over the channel region. A control gate (e.g. 120) is disposed surrounding the first terminal and over the memory material. A plurality of concentric gates (e.g. 120, 131-136, 140) is disposed surrounding the first terminal and over the memory material. The plurality of concentric gates includes the control gate (e.g. 120) as an inner concentric gate. The plurality of concentric gates includes a plurality of intermediate concentric gates (e.g. 131-136) surrounding the inner concentric gate, and an outer concentric gate (e.g. 140) surrounding the plurality of intermediate concentric gates. A conductive line (e.g. 150) is disposed surrounding the plurality of concentric gates and in contact with the second terminal. A patterned conductor line (e.g. 160) is connected to the connector 110 which is in contact with the first terminal.

The inner concentric gate 120 can act as a string select line (SSL), and can be coupled to SSL decoding circuitry via a connector in the inner concentric gate (e.g. 125). The plurality of intermediate concentric gates can act as word lines (WL), and can be connected to word line decoding circuitry via connectors (e.g. 136a). The outer concentric gate 140 can act as a ground select line (GSL), and can be coupled to GSL decoding circuitry via a connector (e.g. 145) in the outer concentric gate. Although the plurality of intermediate concentric gates is shown in FIG. 1 to include 6 intermediate concentric gates, a ring gate NAND cell can have fewer or more intermediate concentric gates such as 2, 4, 8 intermediate concentric gates.

The semiconductor body (e.g. 214) can include a pickup terminal (e.g. 205, FIG. 2) having the first conductivity type (e.g. P-type) located outside the conductive line (e.g. 150), and including a connector (e.g. 105) in contact with the pickup terminal (e.g. 205).

Figure 2:
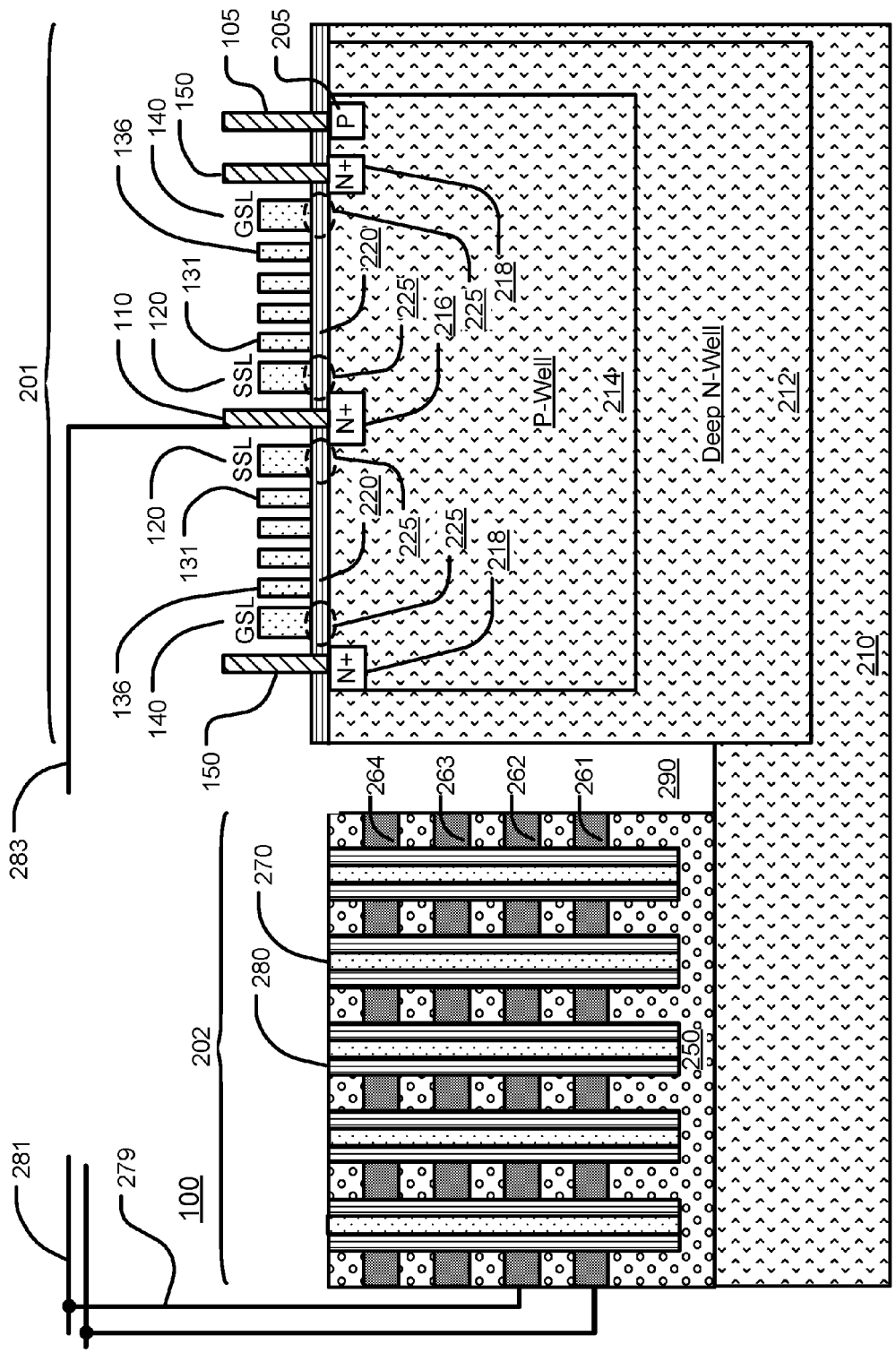
FIG. 2 illustrates a cross-sectional view of an example ring gate NAND cell, taken along A-A' in FIG. 1.

FIG. 2 illustrates a cross-sectional view of an example ring gate NAND cell, taken along A-A' in FIG. 1, in a first region (e.g. 201) on a substrate (e.g. 210). Memory material (e.g. 220) is disposed between the plurality of intermediate concentric gates (e.g. 131-136) and the semiconductor body (e.g. 214). A gate dielectric layer (e.g. 225) is disposed between the inner concentric gate (e.g. 120) and the semiconductor body, and between the outer concentric gate (e.g. 140) and the semiconductor body. In one embodiment, the gate dielectric layer can include the memory material. In another embodiment, the gate dielectric layer can include material different than the memory material, such as silicon oxide.

In one embodiment, the memory material can include a multilayer dielectric charge storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

In another embodiment, a ring gate NAND cell can be a floating gate memory cell, where the memory material between the intermediate concentric gates and the semiconductor body can include a blocking dielectric layer over a polysilicon floating gate over a tunneling layer of oxide material. Thus the polysilicon floating gate is disposed between an intermediate concentric gate acting as a control gate, and the semiconductor body in which a channel can form. A floating gate memory cell can be programmed by trapping electrons on the floating gate, and thus modifying its threshold voltage to represent a logic level.

The connector (e.g. 110) is in contact with the first terminal (e.g. 216). The conductive line (e.g. 150) surrounds the outer concentric gate (e.g. 140), and is in contact with the second terminal (e.g. 218).

The memory device can include an N-well (e.g. 212), and the semiconductor body (e.g. 214) is disposed inside the N-well. The first terminal (e.g. 216) and the second terminal (e.g. 218) can be inside the semiconductor body (e.g. 214) and can include N+ doping.

The semiconductor body (e.g. 214) can include a pickup terminal (e.g. 205) having a first conductivity type (e.g. P-type) located outside the conductive line (e.g. 150), and including a connector (e.g. 105) in contact with the pickup terminal (e.g. 205). The pickup terminal can be used for biasing the semiconductor body. A semiconductor body having P type semiconductor material can be referred to as a P-well, while a semiconductor body having N type semiconductor material can be referred to as an N-well.

Figure 3:
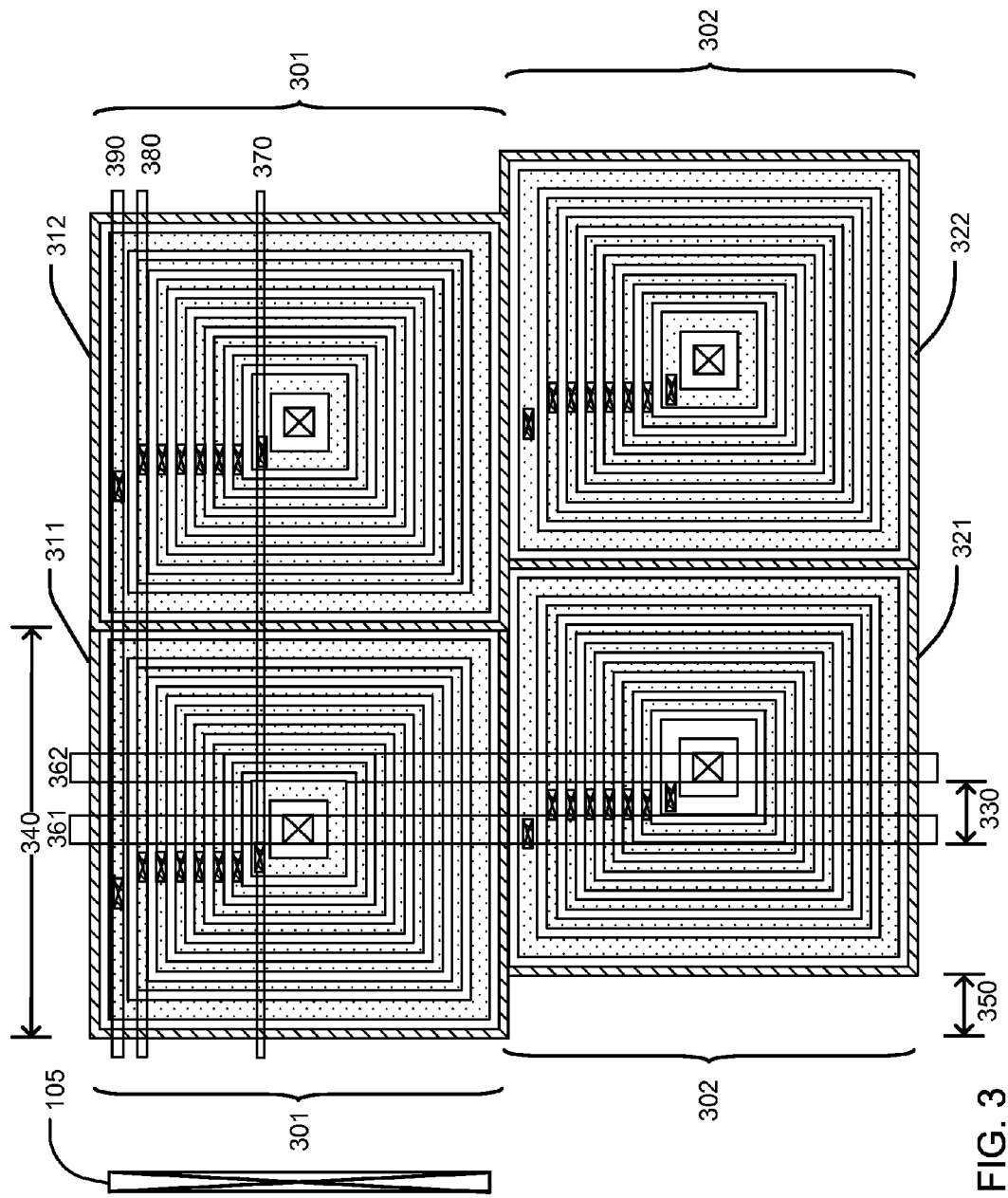
FIG. 3 illustrates a top view of an array of ring gate NAND cells using 2 cells by 2 cells as an example.

FIG. 3 illustrates a top view of an array of ring gate NAND cells using 2 cells by 2 cells as an example. An array of ring gate NAND cells can be disposed in the first region (e.g. 201, FIG. 2) on the substrate (e.g. 210, FIG. 2). An array of ring gate NAND cells can include multiple rows, and each row can include multiple ring gate NAND cells. As illustrated in the example of FIG. 3, the array includes two rows (e.g. 301, 302), and each row includes two ring gate NAND cells, e.g., ring gate NAND cells 311 and 312 in row 301, and ring gate NAND cells 321 and 322 in row 302.

An array of ring gate NAND cells has respective first terminals, and includes a first plurality of patterned conductor lines (e.g. 361, 362) connected to the first terminals of the ring gate NAND cells in the array. Patterned conductor lines in the first plurality of patterned conductor lines can have a first pitch (e.g. 330). Ring gate NAND cells in the array can have a ring gate NAND cell pitch (e.g. 340) greater than the first pitch. A row of ring gate NAND cells in the array of ring gate NAND cells can be placed with an offset (e.g. 350) to match the first pitch.

The memory device can include a plurality of conductors connecting respective concentric gates in the plurality of concentric gates in a row of ring gate NAND cells (e.g. 301). Conductors in the plurality of conductors connected to inner concentric gates in the plurality of concentric gates (e.g. 370) can be coupled to first decoding circuitry acting as SSL decoding circuitry. Conductors in the plurality of conductors connected to intermediate concentric gates in the plurality of concentric gates (e.g. 380) can be coupled to second decoding circuitry acting as word line decoding circuitry. Conductors in the plurality of conductors connected to outer concentric gates in the plurality of concentric gates (e.g. 390) can be coupled to third decoding circuitry acting as GSL decoding circuitry. The memory device can include a conductor connecting the conductive lines (e.g. 150, FIG. 1) in ring gate NAND cells in the array.

In one implementation, an array of ring gate NAND cells can include 16 rows, and each row can include 16 ring gate NAND cells. The first pitch of patterned conductor lines can be 0.086 μm (micrometer), and the ring gate NAND cell pitch can be 16 times the first pitch (16×0.086 μm=1.376 μm), such that with an offset (e.g. 350) to match the first pitch (e.g. 330), 16 patterned conductor lines with the first pitch can be placed over a ring gate NAND cell in the array. If intermediate concentric gates in each row of ring gate NAND cells are connected to 4 word lines via connectors (e.g. 136*a*, FIG. 1) in the intermediate concentric gates, then the array of ring gate NAND cells includes 64 word lines (4 word lines per row times 16 rows=64). Assuming a ring gate NAND cell has a ring gate NAND cell pitch (e.g. 340) in a direction along the patterned conductor lines as in a direction orthogonal to the patterned conductor lines, an array including 16 rows of ring gate NAND cells thus has a dimension of 22 μm (1.376 μm times 16=22 μm) in a direction along the patterned conductor lines (e.g. 361, 362).

The pickup connector (e.g. 105) shown in FIG. 3 is as described in connection with FIG. 1 and FIG. 2.

Figure 4:
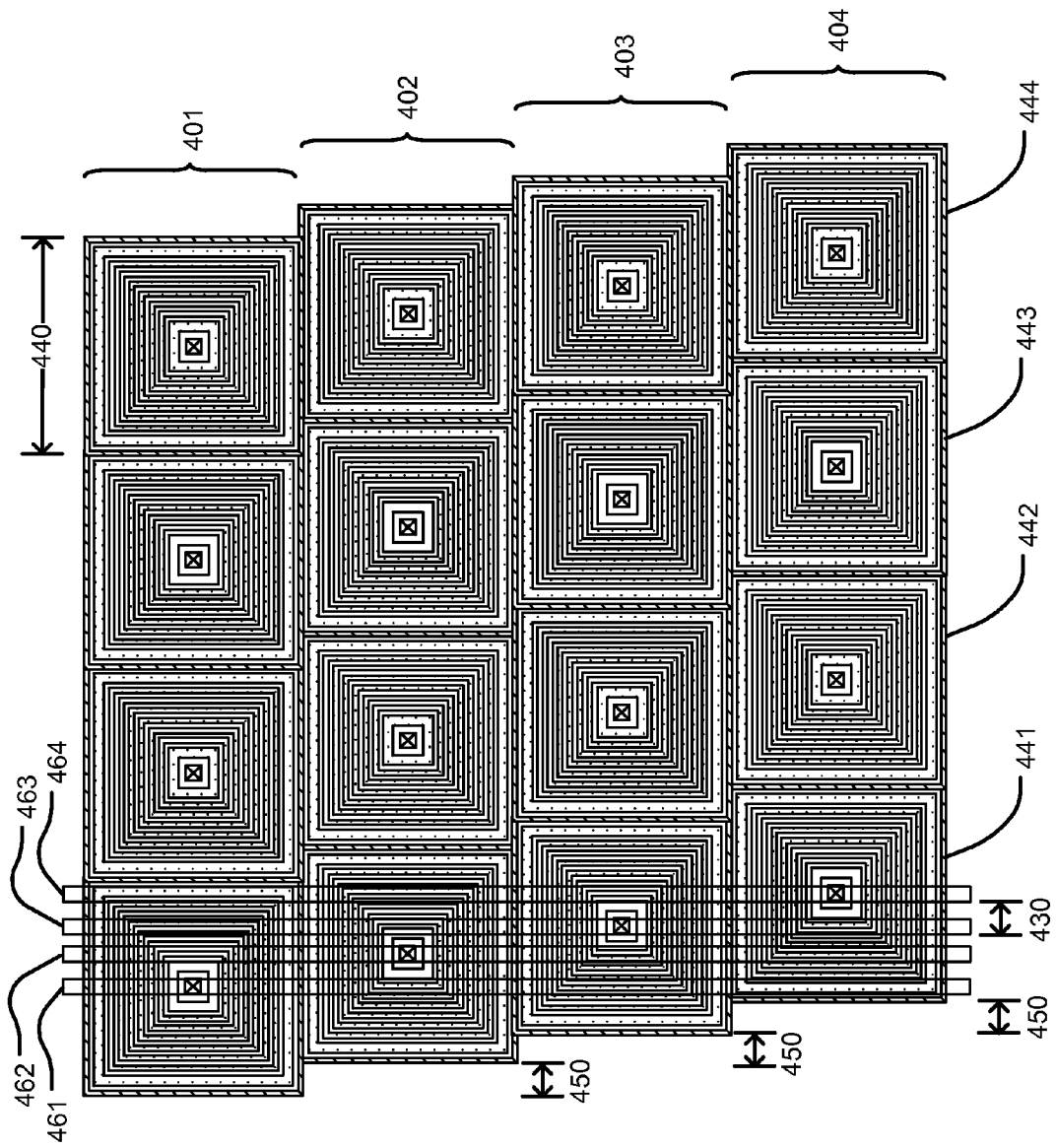
FIG. 4 illustrates a top view of an array of ring gate NAND cells using 4 cells by 4 cells as an example.

FIG. 4 illustrates a top view of an array of ring gate NAND cells using 4 cells by 4 cells as an example. As illustrated in the example of FIG. 4, the array includes four rows (e.g. 401, 402, 403, 404), and each row includes four ring gate NAND cells, e.g., ring gate NAND cells 441, 442, 443 and 444 in row 404.

An array of ring gate NAND cells has respective first terminals, and includes a first plurality of patterned conductor lines (e.g. 461, 462, 463 and 464) connected to the first terminals of the ring gate NAND cells in the array. Patterned conductor lines in the first plurality of patterned conductor lines can have a first pitch (e.g. 430). Ring gate NAND cells in the array can have a ring gate NAND cell pitch (e.g. 440) greater than the first pitch. A row of ring gate NAND cells in the array of ring gate NAND cells can be placed with an offset (e.g. 450) to match the first pitch. For instance, row 402 is placed with an offset 450 from row 401, row 403 is placed with an offset 450 from row 402, row 404 is placed with an offset 450 from row 403, and so on.

FIG. 2 also illustrates a cross-sectional view of an example multilayer array of NAND strings disposed in a second region (e.g. 202) on the substrate (e.g. 210). The multilayer array of NAND strings disposed in the second region is separated from the array of ring gate NAND cells by insulation 290. The multilayer array can include active strips (e.g. 261-264) separated by insulating material (e.g. 250) disposed in a plurality of levels on the substrate, a plurality of structures of a conductive material (e.g. 270) arranged orthogonally over the active strips in the plurality of levels, and memory elements (e.g. 280) in interface regions at cross-points between surfaces of the active strips in the plurality of levels and the plurality of structures.

The active strips (e.g. 261, 262, 263 and 264) can include channel regions for memory cells including the memory elements in the NAND strings. The plurality of structures of a conductive material (e.g. 270) can act as string select lines (SSL), word lines (WL), and ground select lines (GSL) for the multilayer array of NAND strings. The memory elements (e.g. 280) can include the same material as the memory material (e.g. 220) in the first region for the array of ring gate NAND cells, and can be formed at the same manufacturing step when the memory material is formed in the first region.

As shown in the example of FIG. 2, active strip 261 is on a first level in the plurality of levels in the multilayer array. Active strips 262, 263 and 264 are on a second level, a third level and a fourth level, respectively. Although four levels are shown in FIG. 2, a multilayer array of NAND strings can have more levels such as 8 levels, 16 levels, 32 levels, 64 levels, and so on. Levels in the plurality of levels extend over both the first region and the second region. The array of ring gate NAND cells in the first region can be disposed on an upper level in the plurality of levels, and the active strips in the second region can be disposed in at least some levels lower than the upper level.

The memory device can include interlayer connectors (shown schematically as lines 279) connected to the active strips (e.g. 261-264) disposed in the plurality of levels. The interlayer connectors 279 can extend from respective levels in the plurality of levels to a connector surface (e.g. at the level of the patterned conductor lines 281) higher than a top level in the plurality of levels. The memory device can include a second plurality of patterned conductor lines (shown schematically as lines 281) on top of the connector surface and connected to the respective interlayer connectors.

In one embodiment, patterned conductor lines 281 in the second plurality of patterned conductor lines in the multilayer array of NAND strings have a second pitch that matches the first pitch of the first plurality of patterned conductor lines (shown schematically as line 283 in FIG. 2, and e.g. lines 361, 362 in FIG. 3) in the array of ring gate NAND cells. The first plurality of patterned conductor lines (e.g. 361, 362) in the array of ring gate NAND cells and the second plurality of patterned conductor lines 281 in the multilayer array of NAND strings can include the same patterned conductor lines.

In an alternative embodiment, the array of ring gate NAND cells can be disposed in a first region on a substrate, and the memory device can include a logic circuit such as a processor or a gate array, instead of a multilayer array, disposed in a second region on the substrate.

Figure 5:
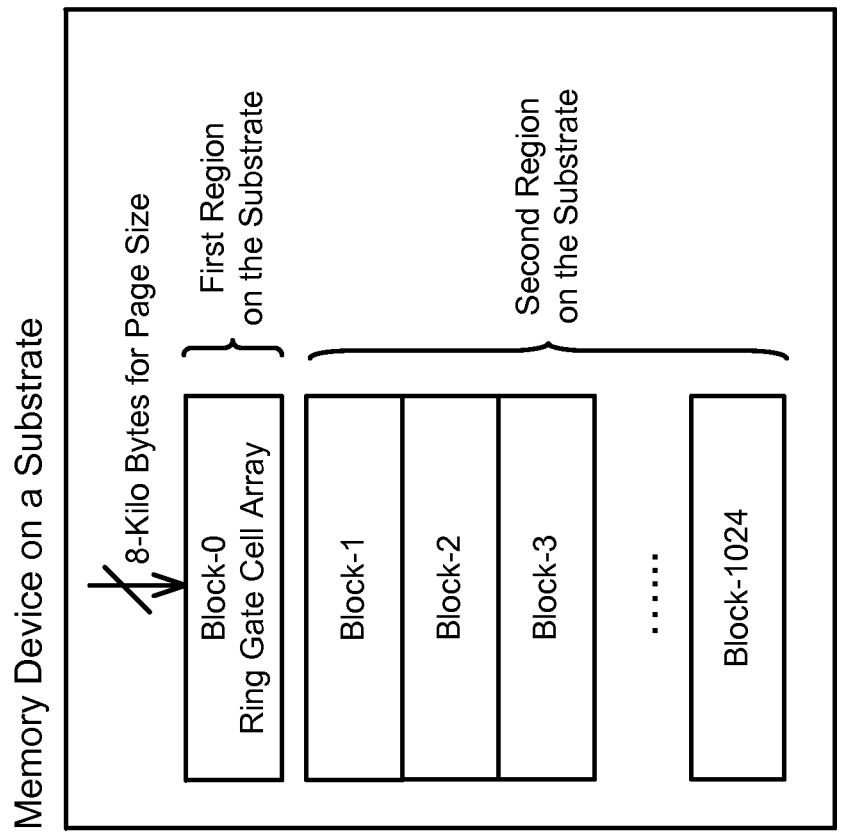
FIG. 5 illustrates arrangement of memory blocks in a memory device including a block of ring gate NAND cells.

FIG. 5 illustrates arrangement of memory blocks in a memory device including a main array comprising a plurality of blocks (Block-1 to Block-1024 in this example) of flash memory cells, and an additional block (Block-0 in the example) including an array of ring cells. The memory device can include for example an array of ring gate NAND cells in a block of ring gate NAND cells (e.g. Block-0) disposed in a first region (e.g. 201, FIG. 2) on a substrate, and a multilayer array of NAND strings in a plurality of blocks of NAND strings (e.g. Block-1 to Block-1024) disposed in a second region (e.g. 202, FIG. 2) on the substrate.

In one embodiment, the block of ring gate NAND cells (e.g. Block-0) and the plurality of blocks of NAND strings can have a same page size, such as 8-kilo bytes, corresponding to 8,192 patterned conductor lines connected to the first terminals of the ring gate NAND cells in the array of ring gate NAND cells, and/or connected to interlayer connectors in the multilayer array of NAND strings. The block of ring gate NAND cells (e.g. Block-0) has fewer pages than a block in the plurality of blocks of NAND strings, because in the blocks of NAND strings, each word line is connected to multiple pages. For instance, Block-0 can have 64 word lines corresponding to 64 pages. In comparison, if each word line in a block of NAND strings is connected to at least 8 pages, then a block of NAND strings has at least 512 pages (8×64=512).

For instance, in a NAND flash memory device including multiple blocks of memory cells, an additional block (e.g. Block-0, FIG. 5) including an array of ring gate memory cells can record critical information for operations of the device. The critical information can include row and column repair information, and parameters for each device to accommodate process variations. Accordingly, the additional block requires a higher reliability than other blocks in the memory device. Wear-leveling procedures can be used to mitigate reliability issues due to limited program/erase (P/E) cycles in NAND flash memory devices, and the additional block can play an important role in recording critical information such as P/E cycling counts for the wear-leveling procedures.

Figure 6:
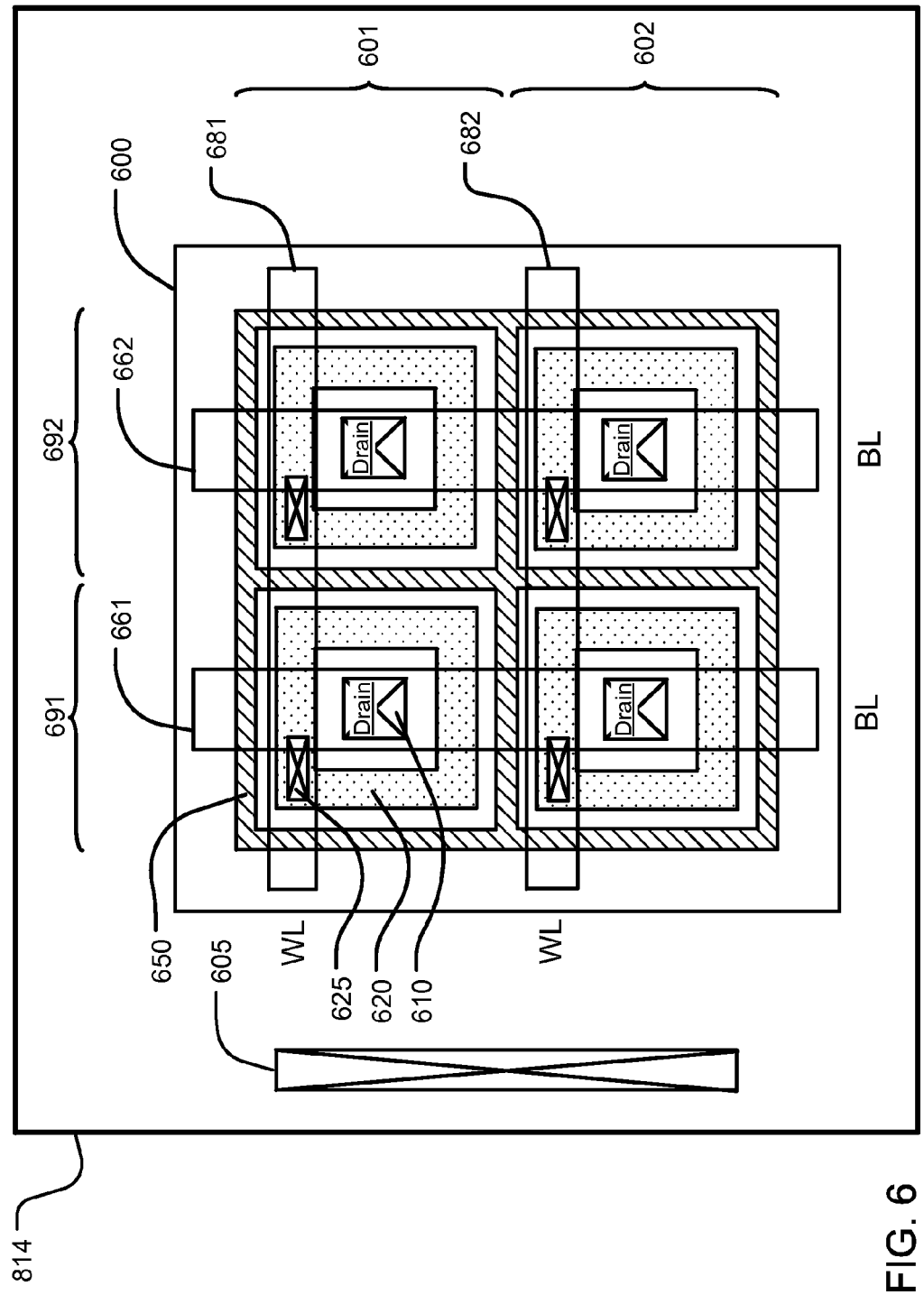
FIG. 6 illustrates a top view of an array of ring gate NOR cells using 2 cells by 2 cells as an example.

FIG. 6 illustrates a top view of an array of ring gate NOR cells (e.g. 600) using 2 cells by 2 cells as an example. A ring gate NOR cell in the array includes a semiconductor body including a first terminal and a second terminal (816, 818, FIG. 8). The semiconductor body has a first conductivity type such as P-type. The first terminal is disposed in the semiconductor body and has a second conductivity type such as N-type. A second terminal is disposed in the semiconductor body and has the second conductivity type. A connector (e.g. 610) is in contact with the first terminal, and can act as a drain terminal of the ring gate NOR cell. The ring gate NOR cell includes a control gate (e.g. 620) surrounding the first terminal and over the semiconductor body. The ring gate NOR cell includes a conductive line (e.g. 650) surrounding the control gate (e.g. 620), and in contact with the second terminal. The memory device can include a conductor connecting the conductive lines (e.g. 650, FIG. 6) in ring gate NOR cells in the array.

Although only 2 cells by 2 cells are shown as an example in FIG. 6, an array of ring gate NOR cells can have 4 cells by 4 cells, 8 cells by 8 cells, 16 cells by 16 cells, and so on. Furthermore, the number of ring gate NOR cells in a row can be different from the number of ring gate NOR cells in a column.

The memory device can include a first plurality of patterned conductor lines (e.g. 661, 662) connected to the first terminals of the ring gate NOR cells in the array. For instance, patterned conductor lines (e.g. 661, 662) can be connected to the connectors 610 in ring gate NOR cells in respective columns (e.g. 691, 692). The memory device can include a first plurality of conductors (e.g. 681, 682) connecting respective control gates (e.g. 620) in a row of ring gate NOR cells (e.g. 601, 602) via connectors 625, where the control gates can act as memory gates of ring gate NOR cells (MG), and conductors in the first plurality of conductors are coupled to word line decoding circuitry.

The semiconductor body (e.g. 814) can include a pickup terminal (e.g. 805, FIG. 8) having the first conductivity type (e.g. P-type) located outside the conductive line (e.g. 650), and including a connector (e.g. 605) in contact with the pickup terminal (e.g. 805).

Figure 7:
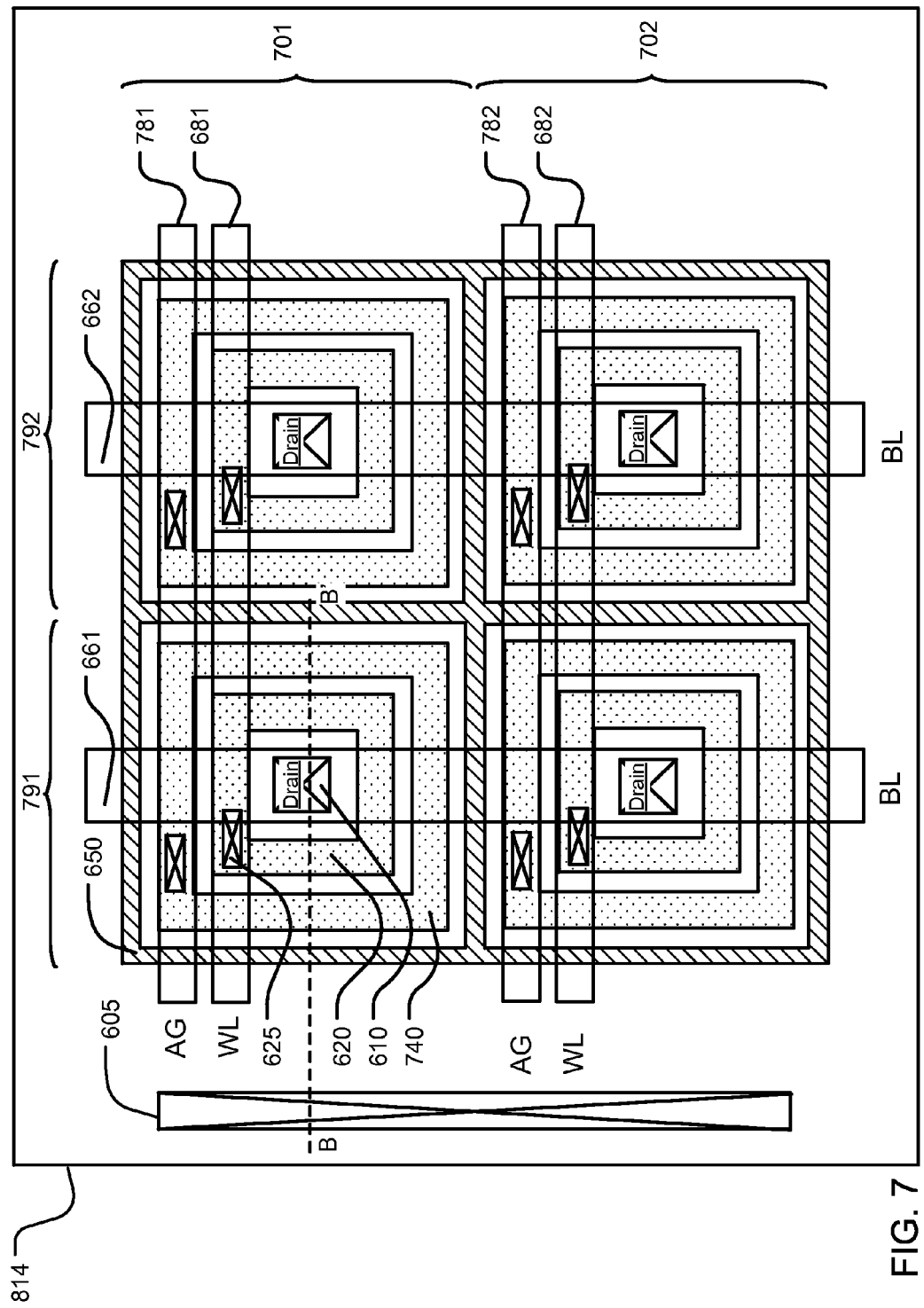
FIG. 7 illustrates a top view of an array of ring gate NOR cells using 2 cells by 2 cells as an example, including a second gate surrounding the control gate.

FIG. 7 illustrates a top view of an array of ring gate NOR cells (e.g. 600) using 2 cells by 2 cells as an example, including a second gate surrounding the control gate. A ring gate NOR cell in the array includes a semiconductor body (e.g. 814, FIG. 8) including a first terminal and a second terminal (e.g. 816 and 818, FIG. 8). The semiconductor body has a first conductivity type such as P-type. The first terminal is disposed in the semiconductor body and has a second conductivity type such as N-type. The second terminal is disposed in the semiconductor body and has the second conductivity type. A connector (e.g. 610) is in contact with the first terminal, and can act as a drain terminal of the ring gate NOR cell. The ring gate NOR cell includes a control gate (e.g. 620) surrounding the first terminal and over the semiconductor body. The ring gate NOR cell includes a conductive line (e.g. 650) surrounding the control gate (e.g. 620), and in contact with the second terminal. The ring gate NOR cell also includes a second gate (e.g. 740) surrounding the control gate and between the control gate and the conductive line, and a gate dielectric layer between the second gate and the semiconductor body (e.g. 814). Although only 2 cells by 2 cells are shown as an example in FIG. 7, an array of ring gate NOR cells including a second gate surrounding the control gate can have 4 cells by 4 cells, 8 cells by 8 cells, 16 cells by 16 cells, and so on. Furthermore, the number of ring gate NOR cells in a row can be different from the number of ring gate NOR cells in a column.

The memory device can include a first plurality of patterned conductor lines (e.g. 661, 662) connected to the first terminals of the ring gate NOR cells in the array. For instance, patterned conductor lines (e.g. 661, 662) are connected to the connectors 610 in ring gate NOR cells in respective columns (e.g. 791, 792). The memory device can include a first plurality of conductors (e.g. 681, 682) connecting respective control gates (e.g. 620) in a row of ring gate NOR cells (e.g. 701, 702) via connectors 625, where the control gates can act as memory gates of ring gate NOR cells (MG), and conductors in the first plurality of conductors are coupled to word line decoding circuitry.

The memory device can include a second plurality of conductors (e.g. 781, 782) connecting respective second gates in a row of ring gate NOR cells (e.g. 701, 702), where the second gates can act as assist gates (AG) of ring gate NOR cells, and conductors in the second plurality of conductors are coupled to the word line decoding circuitry.

The semiconductor body (e.g. 814) can include a pickup terminal (e.g. 805, FIG. 8) having the first conductivity type (e.g. P-type) located outside the conductive line (e.g. 650), and including a connector (e.g. 605) in contact with the pickup terminal (e.g. 805).

Figure 8:
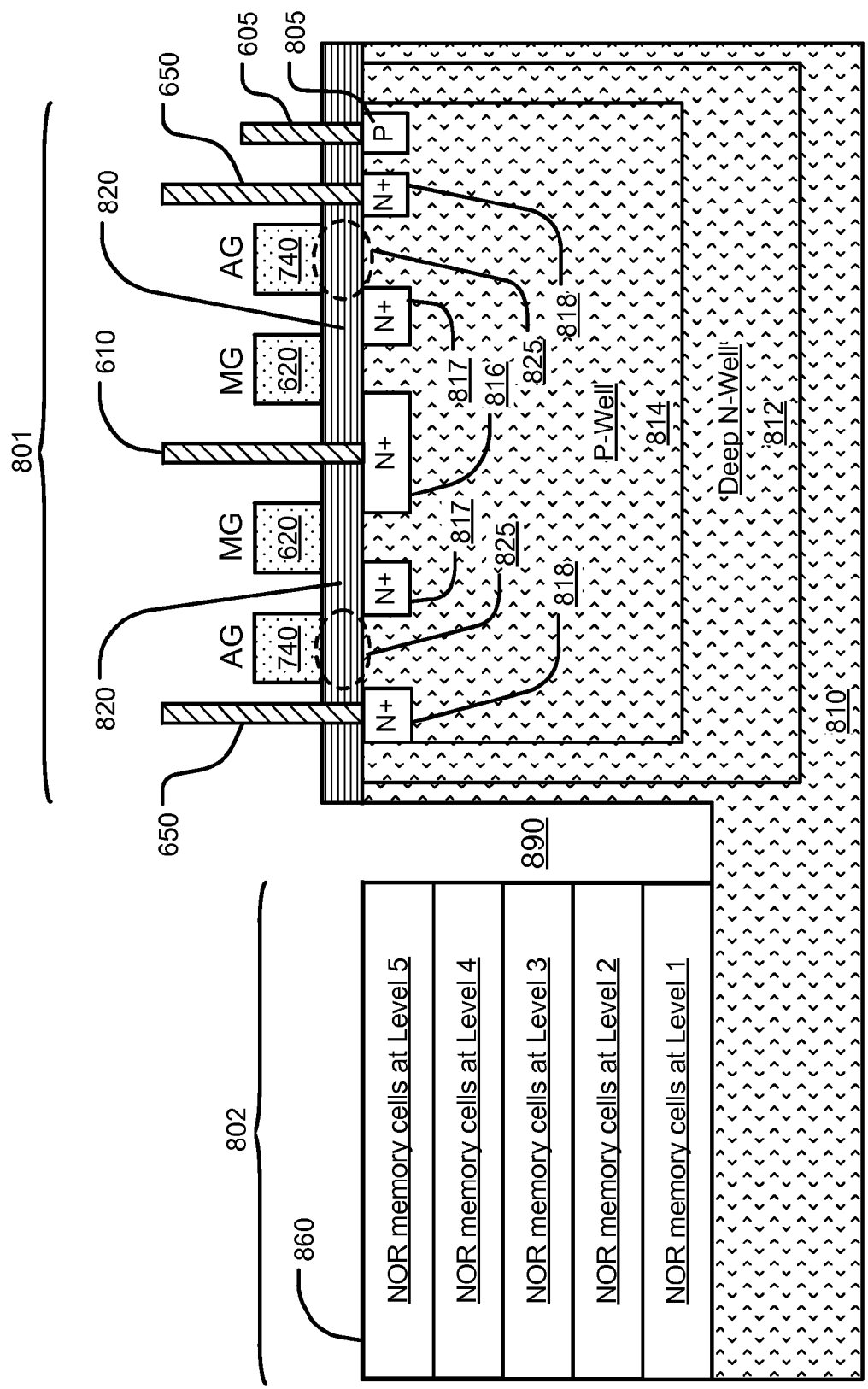
FIG. 8 illustrates a cross-sectional view of an example ring gate NOR cell, taken along B-B' in FIG. 7, in a first region on a substrate.

FIG. 8 illustrates a cross-sectional view of an example ring gate NOR cell, taken along B-B' in FIG. 7, in a first region (e.g. 801) on a substrate (e.g. 810). Memory material (e.g. 820) is disposed between the control gate (e.g. 620) and the semiconductor body (e.g. 814) that has a first conductivity type such as P-type. A gate dielectric layer (e.g. 825) is disposed between the second gate (e.g. 740) and the semiconductor body. In one embodiment, the gate dielectric layer can include the memory material. In another embodiment, the gate dielectric layer can include material different than the memory material, such as silicon oxide.

The memory material for a ring gate NOR cell can be as described herein for the array of ring gate NAND cells. In one embodiment, a ring gate NOR cell can be a floating gate memory cell, where the memory material between the control gate and the semiconductor body can include a blocking dielectric layer over a polysilicon floating gate over a tunneling layer of oxide material. Thus, the polysilicon floating gate is disposed between a control gate acting as a control gate, and the semiconductor body in which a channel can form. A floating gate memory cell can be programmed by trapping electrons on the floating gate, and thus modifying its threshold voltage to represent a logic level.

The connector (e.g. 610) is in contact with the first terminal (e.g. 816). The conductive line (e.g. 650) surrounding the second gate (e.g. 740) is in contact with the second terminal (e.g. 818).

The memory device can include an N-well (e.g. 812), and the semiconductor body (e.g. 814) is disposed inside the N-well. The first terminal (e.g. 816) and the second terminal (e.g. 818) can be inside the semiconductor body (e.g. 814) and can include N+ doping. The semiconductor body can also include N+ regions (e.g. 817) acting as source/drain terminals between the control gate 620 and the second gate 740 and below the layer of material 820. Material 820 may be discontinuous. For example, material 820 could be removed over the N+ regions 817.

The memory device can also include a multilayer array of NOR memory cells (e.g. 860) disposed in a second region on the substrate (e.g. 802). The multilayer array of NOR memory cells disposed in the second region is separated from the array of ring gate NOR cells by insulation 890. NOR memory cells in the multilayer array are disposed in a plurality of levels on the substrate, such as NOR memory cells disposed at Level 1 through Level 5. Levels in the plurality of levels extend over both the first region and the second region. The array of ring gate NOR cells in the first region can be disposed on an upper level in the plurality of levels, and the NOR memory cells in the second region can be disposed in at least some levels lower than the upper level.

The semiconductor body (e.g. 814) can include a pickup terminal (e.g. 805) having the first conductivity type (e.g. P-type) located outside the conductive line (e.g. 650), and including a connector (e.g. 605) in contact with the pickup terminal (e.g. 805). The pickup terminal can be used for biasing the semiconductor body. A semiconductor body having P type semiconductor material can be referred to as a P-well, while a semiconductor body having N type semiconductor material can be referred to as an N-well.

Figure 9:
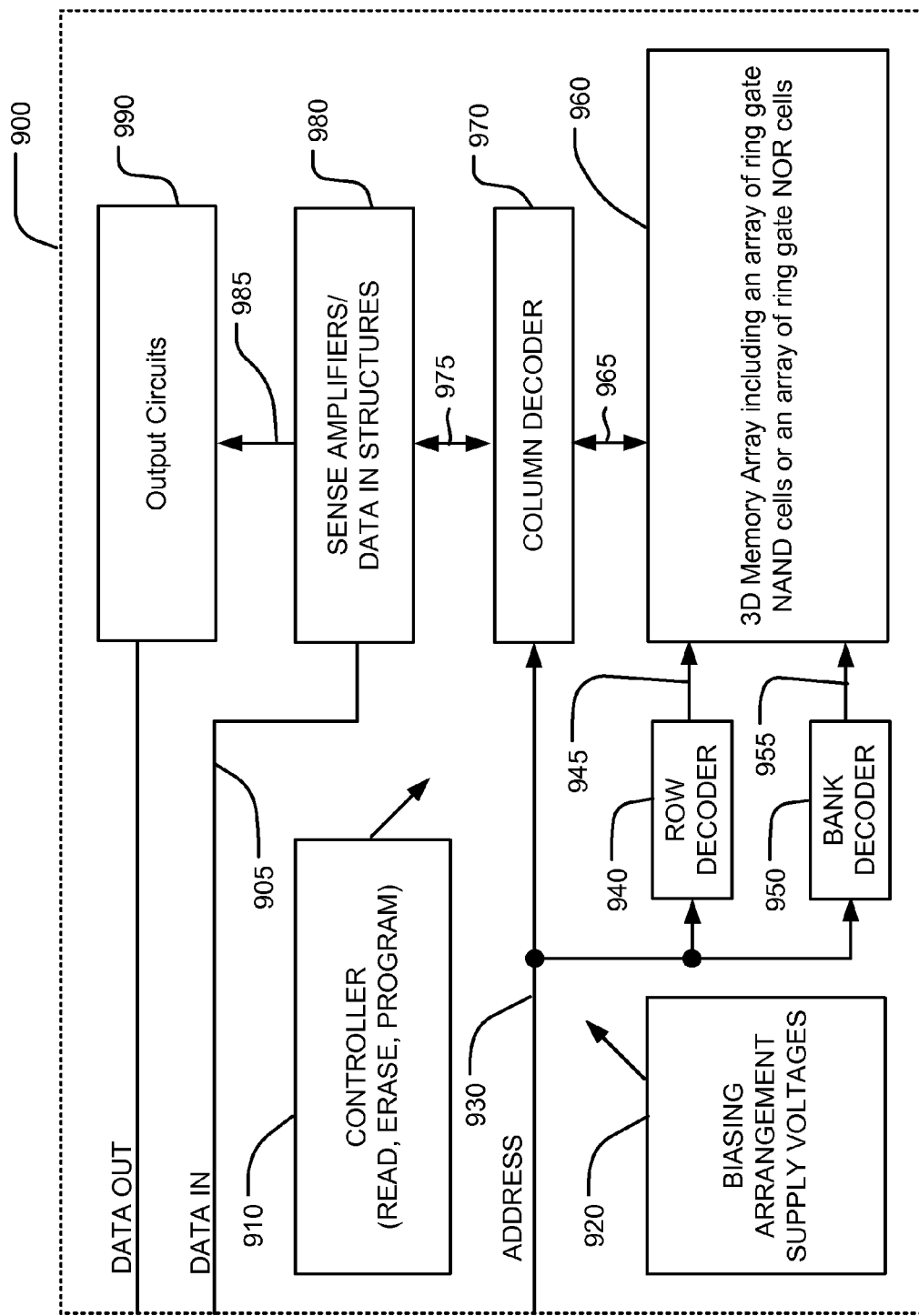
FIG. 9 is a simplified block diagram of an integrated circuit memory device according to an embodiment.

FIG. 9 is a simplified block diagram of an integrated circuit memory device according to an embodiment. The integrated circuit 900 includes a 3D memory array 960 including an array of ring gate memory cells on an integrated circuit substrate. The array of ring gate memory cells can be an array of ring gate NAND cells, or an array of ring gate NOR cells.

A ring gate NAND cell in the array of ring gate NAND cells can include a semiconductor body having a first conductivity type (p-type), a first terminal in the semiconductor body having a second conductivity type (n-type), and a second terminal in the semiconductor body having the second conductivity type. A connector is in contact with the first terminal. A plurality of concentric gates is disposed surrounding the first terminal and over the semiconductor body, including at least an inner concentric gate (SSL) surrounding the first terminal, a plurality of intermediate concentric gates (WLs) surrounding the inner concentric gate, and an outer concentric gate (GSL) surrounding the plurality of intermediate concentric gates.

Memory material is disposed between the plurality of intermediate concentric gates and the semiconductor body. A gate dielectric layer is disposed between the inner concentric gate and the semiconductor body and between the outer concentric gate and the semiconductor body. A conductive line is disposed surrounding the plurality of concentric gates, and is in contact with the second terminal. A ring gate as used in the present specification has a cross-section that can be square, rectangular, or circular.

The semiconductor body can include an N-well, and the semiconductor body can be inside the N-well. The first terminal and the second terminal can be inside the semiconductor body and can include N+ doping. In one embodiment, the gate dielectric layer can include the memory material. In another embodiment, the gate dielectric layer can include material different from the memory material.

The memory device can include an array of ring gate NAND cells, including the first mentioned ring gate NAND cell, having respective first terminals, and including a first plurality of patterned conductor lines connected to the first terminals of the ring gate NAND cells in the array. Patterned conductor lines in the first plurality of patterned conductor lines can have a first pitch. Ring gate NAND cells in the array can have a ring gate NAND cell pitch greater than the first pitch. A row of ring gate NAND cells in the array of ring gate NAND cells can be placed with an offset to match the first pitch.

The memory device can include a plurality of conductors connecting respective concentric gates in the plurality of concentric gates in a row of ring gate NAND cells in the array of ring gate NAND cells. Conductors in the plurality of conductors connected to inner concentric gates in the plurality of concentric gates can be coupled to first decoding circuitry. Conductors in the plurality of conductors connected to intermediate concentric gates in the plurality of concentric gates can be coupled to second decoding circuitry. Conductors in the plurality of conductors connected to outer concentric gates in the plurality of concentric gates can be coupled to third decoding circuitry. The memory device can include a conductor connecting the conductive lines in ring gate NAND cells in the array.

Alternatively, the 3D memory array 960 can include an array of ring gate NOR cells as described herein.

A row decoder 940 is coupled to a plurality of word lines 945, and arranged along rows in the memory array 960. A column decoder 970 is coupled to a plurality of bit lines 965 arranged along columns in the memory array 960 for reading and programming data from the memory cells in the memory array 960. A bank decoder 950 is coupled to a plurality of banks in the memory array 960 on bus 955. Addresses are supplied on bus 930 to column decoder 970, row decoder 940 and bank decoder 950. Sense amplifiers and data-in structures in block 980 are coupled to the column decoder 970, in this example via data bus 975. Sensed data from the sense amplifiers are supplied via output data lines 985 to output circuits 990. Output circuits 990 drive the sensed data to destinations external to the integrated circuit 900. Input data is supplied via the data-in line 905 from input/output ports on the integrated circuit 900 or from other data sources internal or external to the integrated circuit 900, such as a general purpose processor or special purpose application circuitry, or a combination of modules providing system-on-a-chip functionality supported by the 3D memory array 960, to the data-in structures in block 980.

In the example shown in FIG. 9, a controller 910 using a bias arrangement state machine controls the application of bias arrangement supply voltage generated or provided through the voltage supply or supplies in block 920, such as read and program voltages. The controller 910 can include modes of operation for multi-level cell (MLC) programming and reading. The controller 910 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

The technology described herein can be applied to floating gate memory, charge trapping memory, other non-volatile memory, processors and gate arrays. The technology can also be applied as embedded memory in a variety of other semiconductor devices including embedded memory in logic devices, processor devices, system-on-a-chip devices and so on.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory device, comprising:
A ring gate cell, the ring gate cell comprising a semiconductor body having a first conductivity type, a first terminal in the semiconductor body having a second conductivity type, a channel region having the first conductivity type surrounding the first terminal, and a second terminal in the semiconductor body having the second conductivity type surrounding the channel region;
a connector in contact with the first terminal;
memory material over the channel region;
a control gate surrounding the first terminal and over the memory material; and
a conductive line surrounding the control gate and in contact with the second terminal.

2. The device of claim 1, wherein the control gate and the conductive line are ring shaped.

3. The device of claim 1, the semiconductor body including a pickup terminal having the first conductivity type located outside the conductive line, and including a connector in contact with the pickup terminal.

4. The device of claim 1, wherein the connector in contact with the first terminal is connected to a bit line in an overlying patterned conductor layer.

5. The device of claim 1, wherein the conductive line is connected to a common source line in an overlying patterned conductor layer.

6. The device of claim 1, wherein the memory material comprises a dielectric charge storage structure.

7. The device of claim 1, including:
a second channel region in the semiconductor body surrounding the first mentioned channel region and inside the conductive line; and
a second gate surrounding the control gate and over the second channel region.

8. The device of claim 1, wherein the semiconductor body is planar between the first and second terminals.

9. The device of claim 1, wherein there are no insulator filled trenches in the semiconductor body between the first and second terminals.

10. The device of claim 1, including:
a plurality of concentric channel regions surrounding the first terminal, the plurality including said first mentioned channel region; and
a plurality of concentric gates over the plurality of concentric channel regions, the plurality of concentric gates including said control gate.

11. The memory device of claim 1, including an N-well, the semiconductor body inside the N-well, and the first terminal and the second terminal inside the semiconductor body and including N+ doping.

12. The memory device of claim 1, including an array of ring gate NOR cells, including said first mentioned ring gate cell, having respective first terminals, and including a first plurality of patterned conductor lines connected to the first terminals of the ring gate NOR cells in the array.

13. The memory device of claim 12, including a first plurality of conductors connecting respective control gates in a row of ring gate NOR cells in the array of ring gate NOR cells, wherein conductors in the first plurality of conductors are coupled to word line decoding circuitry.

14. The memory device of claim 13, further comprising:
a second gate surrounding the control gate and between the control gate and the conductive line; and
a gate dielectric layer between the second gate and the semiconductor body, including a second plurality of conductors connecting respective second gates in the row,
wherein conductors in the second plurality of conductors are coupled to the word line decoding circuitry; and
wherein the gate dielectric layer includes material different than the memory material.

15. The memory device of claim 12, including a conductor connecting the conductive lines surrounding respective control gates in ring gate NOR cells in the array.

16. The memory device of claim 12, wherein the array of ring gate NOR cells is disposed in a first region on a substrate, and the memory device including a multilayer array of NOR cells disposed in a second region on the substrate, wherein:
the multilayer array of NOR cells is disposed in a plurality of levels on the substrate;
the array of ring gate NOR cells is disposed on an upper level in the plurality of levels; and
NOR cells in the multilayer array of NOR cells are disposed in at least some levels lower than the upper level.

17. A memory device, comprising:
a ring gate NAND cell, the ring gate NAND cell comprising a semiconductor body having a first conductivity type, a first terminal in the semiconductor body having a second conductivity type, and a second terminal in the semiconductor body having the second conductivity type;
a connector in contact with the first terminal;
a plurality of concentric gates surrounding the first terminal and over the semiconductor body, including at least an inner concentric gate surrounding the first terminal, a plurality of intermediate concentric gates surrounding the inner concentric gate, and an outer concentric gate surrounding the plurality of intermediate concentric gates;
memory material between the plurality of intermediate concentric gates and the semiconductor body, and a gate dielectric layer between the inner concentric gate and the semiconductor body and between the outer concentric gate ring and the semiconductor body; and
a conductive line surrounding the plurality of concentric gates and in contact with the second terminal.

18. The memory device of claim 17, including an N-well, the semiconductor body inside the N-well, and the first terminal and the second terminal inside the semiconductor body and including N+ doping.

19. The memory device of claim 17, wherein the gate dielectric layer includes the memory material.

20. The memory device of claim 17, including an array of ring gate NAND cells, including said first mentioned ring gate NAND cell, having respective first terminals, and including a first plurality of patterned conductor lines (361, 362) connected to the first terminals of the ring gate NAND cells in the array.

21. The memory device of claim 20, wherein:
patterned conductor lines in the first plurality of patterned conductor lines have a first pitch;
ring gate NAND cells in the array have a ring gate NAND cell pitch greater than the first pitch; and
a row of ring gate NAND cells in the array of ring gate NAND cells is placed with an offset to match the first pitch.

22. The memory device of claim 20, including:
a plurality of conductors connecting respective concentric gates in the plurality of concentric gates in a row of ring gate NAND cells in the array of ring gate NAND cells, wherein:
conductors in the plurality of conductors connected to inner concentric gates in the plurality of concentric gates are coupled to first decoding circuitry;
conductors in the plurality of conductors connected to intermediate concentric gates in the plurality of concentric gates are coupled to second decoding circuitry; and
conductors in the plurality of conductors connected to outer concentric gates in the plurality of concentric gates are coupled to third decoding circuitry.

23. The memory device of claim 20, wherein the conductive lines surrounding the respective pluralities of concentric gates in ring gate NAND cells in the array are connected by a conductor.

24. The memory device of claim 20, wherein the array of ring gate NAND cells is disposed in a first region on a substrate, and including a multilayer array of NAND strings disposed in a second region on the substrate.

25. The memory device of claim 24, wherein the multilayer array comprises:
active strips disposed in a plurality of levels on the substrate;
a plurality of structures of a conductive material arranged orthogonally over the active strips in the plurality of levels; and
memory elements in interface regions at cross-points between surfaces of the active strips in the plurality of levels and the plurality of structures.

26. The memory device of claim 25, wherein the array of ring gate NAND cells is disposed on an upper level in the plurality of levels, and the active strips are disposed in at least some levels lower than the upper level, further comprising:
interlayer connectors connected to the active strips disposed in the plurality of levels, the interlayer connectors extending from respective levels in the plurality of levels to a connector surface higher than a top level in the plurality of levels; and
a second plurality of patterned conductor lines on top of the connector surface and connected to the respective interlayer connectors, wherein
patterned conductor lines in the first plurality of patterned conductor lines have a first pitch; and
patterned conductor lines in the second plurality of patterned conductor lines have a second pitch that matches the first pitch.

* * * * *